United States Patent
Shen et al.

(10) Patent No.: US 11,507,718 B1
(45) Date of Patent: Nov. 22, 2022

(54) CHIP VERIFICATION SYSTEM AND VERIFICATION METHOD THEREFOR

(71) Applicant: REALTEK SEMICONDUCTOR CORP., Hsinchu (TW)

(72) Inventors: Xiang-Hua Shen, Hsinchu (TW); Dong Qiu, Hsinchu (TW); De-Pin Zheng, Hsinchu (TW); Meng Liu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/462,647

(22) Filed: Aug. 31, 2021

(30) Foreign Application Priority Data

May 8, 2021 (CN) .......................... 202110500747.3

(51) Int. Cl.
| | |
|---|---|
| *G06F 30/3308* | (2020.01) |
| *G06F 30/333* | (2020.01) |
| *G06F 30/367* | (2020.01) |
| *G06F 30/398* | (2020.01) |
| *G06F 11/00* | (2006.01) |
| *G01R 31/28* | (2006.01) |

(52) U.S. Cl.
CPC ........ *G06F 30/3308* (2020.01); *G06F 30/333* (2020.01); *G01R 31/28* (2013.01); *G06F 11/00* (2013.01); *G06F 30/367* (2020.01); *G06F 30/398* (2020.01)

(58) Field of Classification Search
CPC .... G06F 11/00; G06F 30/3308; G06F 30/333; G06F 30/367; G06F 30/398; G01R 31/28
USPC ....... 716/106, 111, 136; 703/16; 714/30, 32, 714/726, 733, 741
See application file for complete search history.

(56) References Cited

U.S. PATENT DOCUMENTS

| | | | | |
|---|---|---|---|---|
| 4,527,253 | A | * | 7/1985 | Sato ...................... G06F 16/284 |
| 4,918,594 | A | * | 4/1990 | Onizuka ................. G06F 30/33 703/2 |
| 5,696,772 | A | * | 12/1997 | Lesmeister ...... G01R 31/31921 324/73.1 |
| 5,701,308 | A | * | 12/1997 | Attaway ........ G01R 31/318552 714/740 |

(Continued)

*Primary Examiner* — Phallaka Kik
(74) *Attorney, Agent, or Firm* — Birch, Stewart, Kolasch & Birch, LLP

(57) ABSTRACT

A chip verification system includes a plurality of agent modules, a register model, and a scoreboard module. The register model includes a register database, a plurality of access modules, and a return module. Each access module corresponds to one of a plurality of attribute parameters. Each agent module transmits an address code of its sequence to the return module. The return module obtains, according to the received address code, an address subject and the attribute parameter corresponding to the received address code from the register database, and outputs the obtained attribute parameter. Each driver module calls, according to the received attribute parameter, the corresponding access module to perform an operation on registers of DUT circuit according to a read write command of the sequence. The scoreboard module records each performed operation to generate an operation record, and outputs a verification result according to the operation record and data in registers.

16 Claims, 4 Drawing Sheets

(56) References Cited

U.S. PATENT DOCUMENTS

| | | | | |
|---|---|---|---|---|
| 5,748,642 A * | 5/1998 | Lesmeister | G01R 31/3191 | 714/724 |
| 6,003,142 A * | 12/1999 | Mori | G06F 11/2236 | 714/E11.166 |
| 6,085,278 A * | 7/2000 | Gates | G06F 13/32 | 710/266 |
| 6,323,639 B1 * | 11/2001 | Park | G01R 31/2884 | 438/106 |
| 6,343,366 B1 * | 1/2002 | Okitaka | G11C 29/44 | 714/719 |
| 6,479,983 B1 * | 11/2002 | Ebiya | G01R 31/3191 | 324/762.01 |
| 6,487,700 B1 * | 11/2002 | Fukushima | G01R 31/31705 | 716/106 |
| 6,658,611 B1 * | 12/2003 | Jun | G11C 29/50012 | 365/201 |
| 7,269,780 B2 * | 9/2007 | Arima | G06F 1/3203 | 714/764 |
| 7,428,662 B2 * | 9/2008 | Benedix | G11C 29/40 | 714/30 |
| 8,972,741 B2 * | 3/2015 | Awatsu | G06Q 20/40145 | 726/20 |
| 9,798,842 B1 * | 10/2017 | Hutton | G06F 30/333 | |
| 9,865,362 B1 * | 1/2018 | Arora | G11C 29/02 | |
| 2002/0108056 A1 * | 8/2002 | Hatakeyama | G01R 31/3187 | 726/29 |
| 2002/0194545 A1 * | 12/2002 | Abbott | G11C 29/26 | 714/42 |
| 2004/0230882 A1 * | 11/2004 | Huott | G06F 11/27 | 714/E11.169 |
| 2005/0278595 A1 * | 12/2005 | Anzou | G01R 31/3187 | 714/733 |
| 2006/0156091 A1 * | 7/2006 | Aipperspach | G11C 29/16 | 714/718 |
| 2008/0052570 A1 * | 2/2008 | Kyung | G11C 29/08 | 714/719 |
| 2010/0135164 A1 * | 6/2010 | Rofougaran | G06F 11/2294 | 370/248 |
| 2011/0231709 A1 * | 9/2011 | Bellocchio | G06F 11/0751 | 714/38.1 |
| 2014/0005992 A1 * | 1/2014 | Deindl | G06F 30/331 | 703/4 |
| 2018/0060168 A1 * | 3/2018 | Kelly | H03M 13/2906 | |
| 2019/0155765 A1 * | 5/2019 | Lee | G06F 12/0238 | |
| 2020/0285628 A1 * | 9/2020 | Honda | G06F 16/2365 | |
| 2021/0265003 A1 * | 8/2021 | Lee | G11C 11/1673 | |
| 2021/0318377 A1 * | 10/2021 | Koskinen | G01R 31/30 | |
| 2021/0326134 A1 * | 10/2021 | Grocutt | G06F 9/355 | |

* cited by examiner

CHIP VERIFICATION SYSTEM AND VERIFICATION METHOD THEREFOR

CROSS-REFERENCE TO RELATED APPLICATION

This non-provisional application claims priority under 35 U.S.C. § 119(a) to Patent Application No. 202110500747.3 filed in China, P.R.C. on May 8, 2021, the entire contents of which are hereby incorporated by reference.

BACKGROUND

Technical Field

The present invention relates to a verification technology, and in particular, to a chip verification system capable of verifying registers to be accessed in different manners and a verification method therefor.

Related Art

Generally, after designing of a chip (or an integrated circuit) and before mass production, a function of the designed chip needs to be verified to detect whether the chip can normally operate (for example, whether a register of the chip can be correctly accessed). Since an existing chip usually has some design specifications and may be externally connected to various devices, and different devices may support different access manner (for example, support different communication protocols), the register of the chip needs to support special access manners corresponding to the foregoing access manners or in accordance with the design specifications (such as an electronic fuse (eFuse) access manner or an electrically-erasable programmable read-only memory (EEPROM) access manner), so as to perform data transmission with the external devices or conform to the design specifications.

In general, in order to verify each different access manner, a corresponding verification platform, a corresponding verification system (such as various different verification platform architectures established based on universal verification methodology (UVM)), or a corresponding test item needs to be established for each access manner. However, such a method not only increases workloads and a design duration of a verification system, but also fails to verify a chip in mixed scenarios and in a scenario in which different access manners are used together. For example, the chip may operate with various different access manners functioning together, or during different operation phases (such as an initialization phase, a stable power supply phase, and a normal operation phase), the chip may operate with different access manners functioning. Therefore, the forgoing single verification system for verification of a single access manner cannot realize the verification of the chip.

SUMMARY

In view of the above, the present disclosure provides a chip verification system and a verification method therefor. In some embodiments, by means of the chip verification system based on universal verification methodology and the verification method therefor, function verification of registers to be accessed in different manners can be realized by using a single verification system, and situations of accessing the registers of a chip at different operation phases can be simulated.

According to some embodiments, the chip verification system is adapted to verify a design under test (DUT) circuit. The DUT circuit includes a plurality of registers. The chip verification system includes a plurality of agent modules, a register model, and a scoreboard module. Each agent module includes a sequence and a driver module. Each sequence includes an address code and a read write command. The register model includes a register database, a plurality of access modules, and a return module. The register database stores an address subject and an attribute parameter of each register. The address subject corresponds to the attribute parameter of the same register. Each access module corresponds to one of the attribute parameters. Each agent module is configured to transmit the address code of the sequence of its own to the return module. The return module is configured to obtain, according to the received address code, the address subject and the attribute parameter corresponding to the received address code from the register database, and output the corresponding attribute parameter. The driver module of each agent module is configured to call, according to the received output attribute parameter, the corresponding access module to perform an operation on the registers of the DUT circuit according to the read write command of the same agent module. The scoreboard module is configured to record each performed operation to generate an operation record, and output a verification result according to the operation records and data in the registers.

According to some embodiments, the verification method for a chip verification system is adapted to verify a DUT circuit. The DUT circuit includes a plurality of registers. The chip verification system includes a plurality of agent modules, a register model, and a scoreboard module. The register model includes a register database, a plurality of access modules, and a return module. Each agent module includes a sequence and a driver module. The register database stores an address subject and an attribute parameter of each register. The address subject corresponds to the attribute parameter of the same register. The method includes: transmitting, by each agent module, an address code of the sequence of the each agent module to the return module, where each sequence includes an address code and a read write command, and each access module corresponds to one of the attribute parameters; obtaining, by the return module according to the received address code, the address subject and the attribute parameter corresponding to the received address code from the register database, and outputting the corresponding attribute parameter; calling, by the driver module of each agent module according to the received output attribute parameter, the corresponding access module to perform an operation on the registers of the DUT circuit according to the read write command of the same agent module; recording, by the scoreboard module, each performed operation to generate an operation record; and outputting, by the scoreboard module, a verification result according to the operation records and data in the registers.

In conclusion, according to some embodiments of the present disclosure, by means of the plurality of the access modules respectively corresponding to different access manners and the return module capable of returning the attributes of the registers of the chip, function verification of the registers to be accessed in different manners can be realized by using a single verification system, thereby reducing workloads and a design duration of the verification system, and enhancing portability and verification coverage of the verification system.

DETAILED DESCRIPTION

Figure 1:
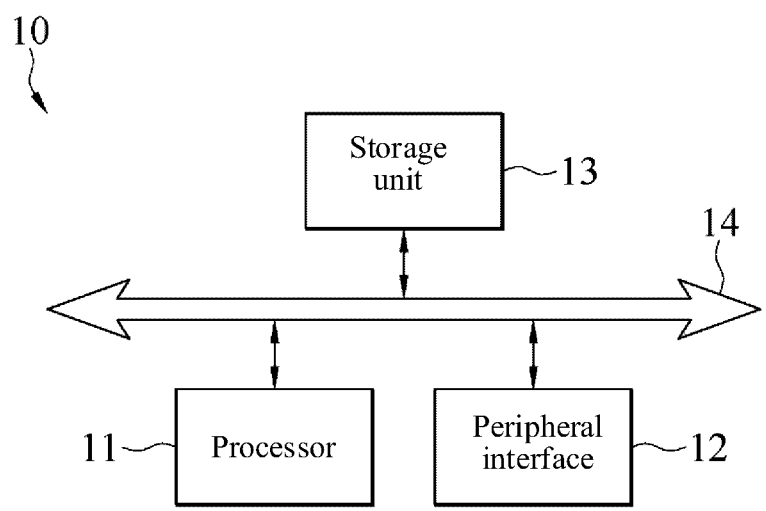
FIG. 1 is a schematic block diagram of an electronic device according to some embodiments of the present disclosure.
Figure 2:
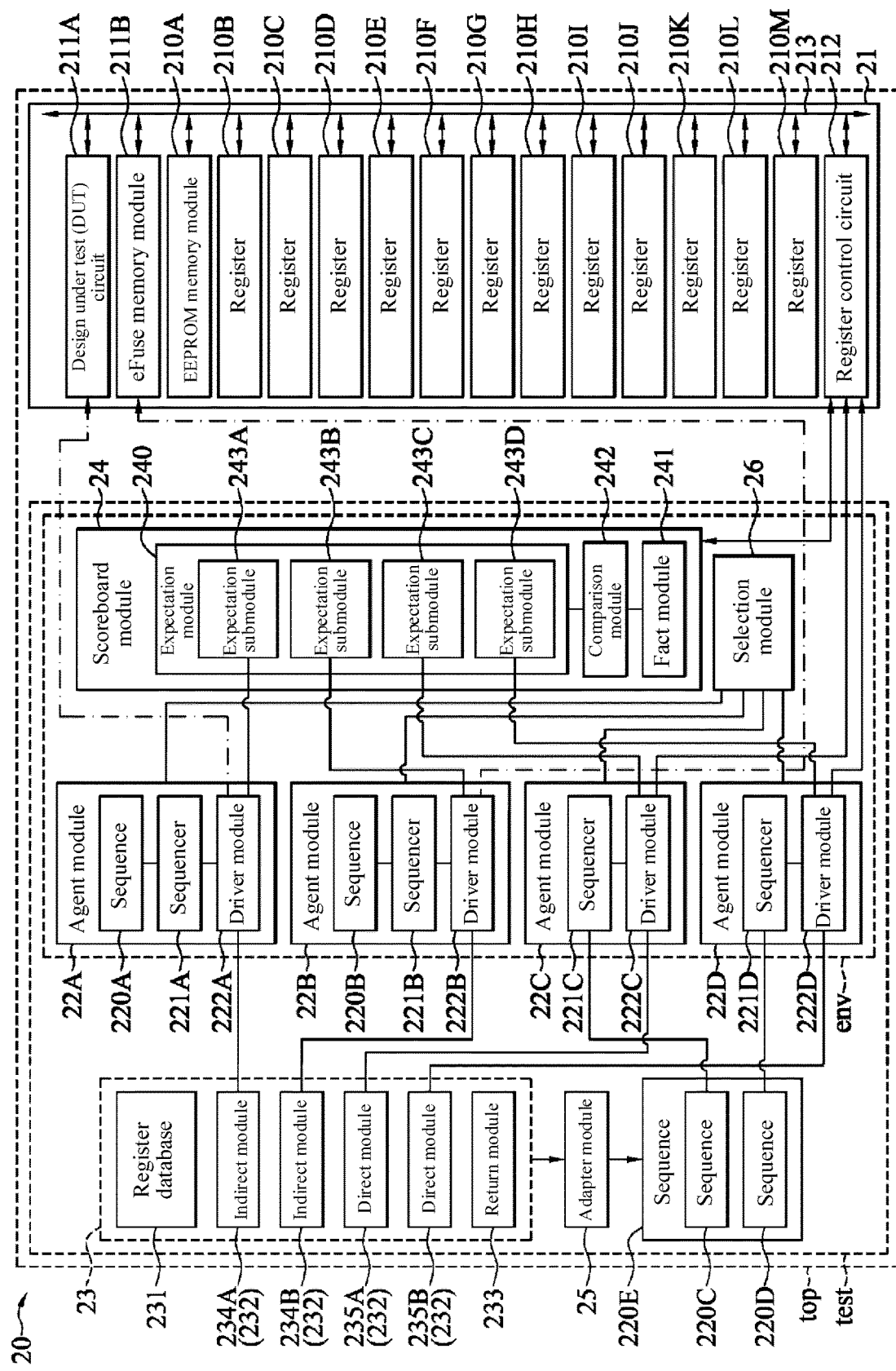
FIG. 2 is a schematic block diagram of a chip verification system according to some embodiments of the present disclosure.
Figure 3:
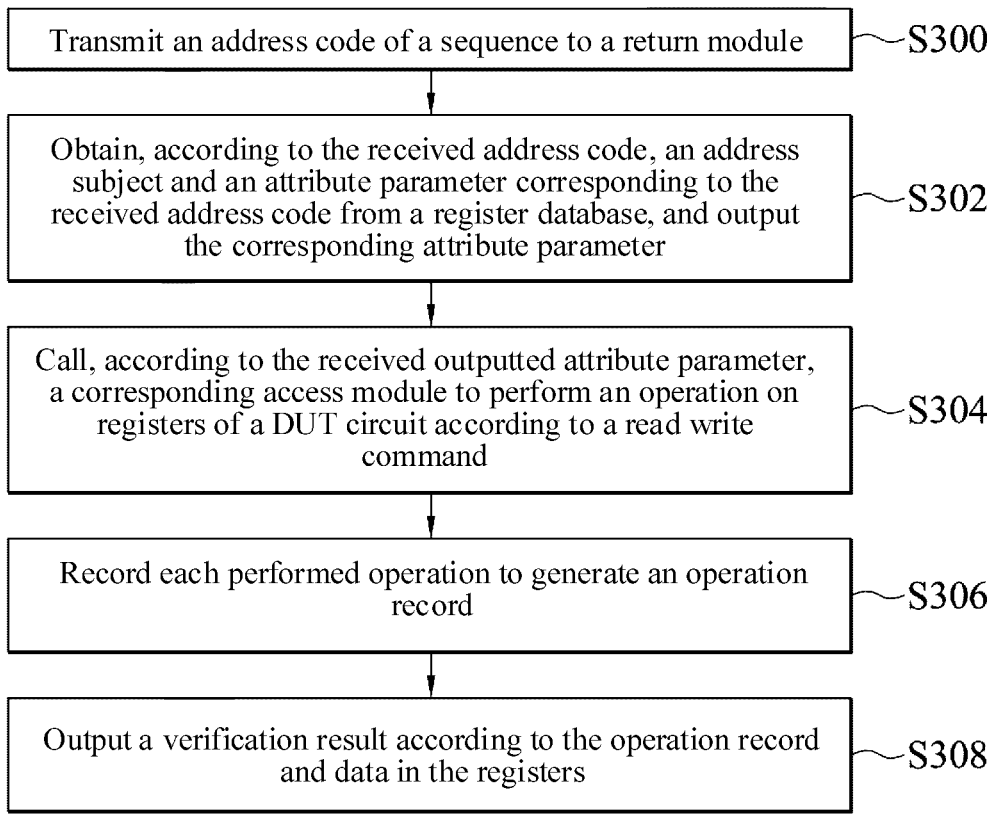
FIG. 3 is a schematic flowchart of a verification method for the chip verification system according to some embodiments of the present disclosure.

Refer to FIG. 1 to FIG. 3. FIG. 1 is a schematic block diagram of an electronic device 10 according to some embodiments of the present disclosure. FIG. 2 is a schematic block diagram of a chip verification system 20 according to some embodiments of the present disclosure. FIG. 3 is a schematic flowchart of a verification method for the chip verification system 20 according to some embodiments of the present disclosure. The verification method may be performed by the chip verification system 20, so as to simulate operation of a chip and verify whether a function of a storage element of the chip is correct. The electronic device 10 may be an exemplary environment for the chip verification system 20. For example, the chip verification system 20 may be implemented by a computer program product (specifically, the chip verification system 20 is a verification platform established based on universal verification methodology, and the verification platform may have a top layer (top), a test layer (test), and an environment layer (env) according to a layered protocol of the universal verification methodology), so that the corresponding verification method for the chip verification system 20 can be completed after a program is loaded and executed in the electronic device 10. In some embodiments, the computer program product may be a readable storage medium, and the program is stored in the readable storage medium for loading by the electronic device 10. In some embodiments, the computer program product may be transmitted to the electronic device 10 in wired or wireless.

The electronic device 10 includes a processor 11, a peripheral interface 12, a storage unit 13, and a bus 14 affording communication among the elements. The processor 11 may be a central processing unit (CPU). The peripheral interface 12 may include, for example, an input/output interface, a drawing interface, a communication interface (such as a network interface), etc. The storage unit 13 may be a temporary, non-temporary, or temporary and non-temporary storage medium such as a memory or a hard disk. The bus 14 may be one or more combinations of a system bus, a memory bus, and a peripheral bus. In some embodiments, the electronic device 10 may be composed of one or more computing devices.

Referring to FIG. 2, a chip verification system 20 is adapted to verify a design under test (DUT) circuit 21. The DUT circuit 21 is implemented by using a circuit behavior and a hardware description of a chip that are described by using a hardware description program file, so as to simulate the chip. The hardware description program file is coded by using codes such as but not limited to very high-speed hardware description language (VHDL) code and Verilog. The DUT circuit 21 includes a plurality of registers 210A-210M. The registers 210A to 210M are configured to provide memory functions, such as read and/or write functions. Specifically, the registers 210A-210M are configured to simulate the storage element of the chip.

In some embodiments, the DUT circuit 21 further includes a register control circuit 212 and a bus 213 affording communication among the elements in the DUT circuit 21. The register control circuit 212 is configured to receive a signal from the chip verification system 20 to control the registers 210A-210M by using the bus 213 (for example, to read the registers 210A-210M or write data into the registers 210A-210M). The register control circuit 212 is also configured to transmit a data signal (for example, a data signal formed by converting the data in the registers 210A-210M to a data signal packet) to the chip verification system 20 for processing. In some embodiments, the foregoing top layer (top) is a topmost layer of the chip verification system 20, and is configured to instantiate the DUT circuit 21, the test layer (test), and a virtual interface (not shown in the figure) coupled between the DUT circuit 21 and the test layer (test). The virtual interface has all communication protocols adopted by an output/input interface (not shown in the figure) of the DUT circuit 21, so as to assist communication transmission between the test layer (test) and the DUT circuit 21. For example, the register control circuit 212 performs communication transmission with the chip verification system 20 by using the virtual interface.

As shown in FIG. 2, the chip verification system 20 includes a plurality of agent modules 22A-22D, a register model 23, and a scoreboard module 24. The agent modules 22A-22D are coupled to the register model 23, the scoreboard module 24, and the DUT circuit 21. Although FIG. 2 illustrates four agent modules 22A-22D, the present invention is not limited thereto. A quantity of the agent modules 22A-22D may be adjusted according to actual requirements. The agent modules 22A-22D respectively include sequences 220A-220D and driver modules 222A-222D. The driver modules 222A-222D are respectively configured to convert the sequences 220A-220D to agent signals for transmission to the DUT circuit 21 for the DUT circuit 21 to perform corresponding processing. Each of the sequences 220A-220D includes an address code and a read write command for simulating a command delivered by a microcontroller of the chip to the storage element of the chip. In some embodiments, the sequences 220A-220D may be respectively inputted into the agent modules 22A-22D by a user or may be respectively transmitted to the agent modules 22A-22D after being generated in the register model 23. In some embodiments, the chip verification system 20 instantiates the register model 23 in the test layer (test) and the foregoing universal verification environment layer (env) based on the general verification methodology. The verification environment layer (env) is configured to instantiate a specific verification element, such as the agent modules 22A-22D and the scoreboard module 24.

In some embodiments, the agent modules 22A-22D further respectively include a sequencer 221A-221D. The sequencers 221A-221D are coupled between the sequences 220A-220D and the driver modules 222A-222D. The sequencers 221A-221D are respectively configured to manage the sequences 220A-220D of the agent modules 22A-22D to transmit the sequences 220A-220D to the corresponding driver modules 222A-222D in response to request messages of the driver modules 222A-222D of the agent modules 22A-22D. In some embodiments, in some cases, the sequences (such as 220C and 220D) of some agent modules (such as 22C and 22D) may be integrated together, for example, integrated into a single sequence 220E. In some embodiments, all of the sequences 220A-220D may be collectively managed by using a virtual sequencer (not shown in the figure). The virtual sequencer transmits the sequences 220A-220D to the corresponding sequencers 221A-221D upon receipt of the request messages from the sequencers 221A-221D.

As shown in FIG. 2, the register model 23 includes a register database 231, a plurality of access modules 232, and a return module 233. Although FIG. 2 illustrates four access modules 232, the present invention is not limited thereto. A quantity of the access modules 232 may be set according to the quantity of the agent modules 22A-22D. The register database 231 is configured to store an address subject and an attribute parameter of each of the registers 210A-210M. The address subject corresponds to the attribute parameter of the same one of the registers 210A-210M. Each access module 232 corresponds to one of the attribute parameters. The address subjects are addresses of the registers 210A-210M, and the attribute parameters are detailed attributes related to the registers 210A-210M. The detailed attributes such as manners allowed for accessing the registers 210A-210M (for example, direct access by using an interface of a communication protocol or indirect access by using a path list, that is, access parameters described later), parameters indicated that whether the registers are readable or writeable (that is, read write parameters described later), etc.

In some embodiments, different access modules 232 correspond to different manners allowed for accessing the registers 210A-210M. the access modules 232 has function command sets corresponding to the manners allowed for accessing. For example, a direct module 235A described later has a function command set describing I2C direct access, a direct module 235B has a function command set describing SPI direct access, an indirect module 234A has a function command set describing eFuse indirect access (specifically, the function command set describes actions in an eFuse path list described later), and an indirect module 234B has a function command set describing EEPROM indirect access (specifically, the function command set describes actions in an EEPROM path list described later).

In some embodiments, the chip verification system 20 further includes an adapter module 25. The adapter module 25 is coupled between the register model 23 and some of the agent modules (such as 22C and 22D) (specifically, the adapter module 25 is coupled between the register model 23 and the single sequence 220E formed by integrating the agent modules 22C and 22D). The adapter module 25 is configured to convert transaction information generated by the register model 23 to the sequences (such as 220C and 220D) that may be recognized and executed by the driver modules (such as 222C and 222D).

In some embodiments, since the chip verification system 20 is established based on the universal verification methodology, in addition to the foregoing modules, other elements (modules) related to the foregoing modules may be further established in the chip verification system 20 based on the universal verification methodology during establishment, so that the chip verification system 20 can perform functions provided in the universal verification methodology. For example, the driver modules 222A-222D may directly access the registers 210A-210M by using an interface of the register model 23 (for example, according to some settings in the universal verification methodology, the interface of the register model 23 may be coupled to the foregoing virtual interface, so as to access the registers 210A-210M).

A verification method for the chip verification system 20 is described below. Referring to FIG. 3, first, the agent modules 22A-22D respectively transmit address codes of the sequences 220A-220D of the agent modules (its own) to the return module 233 (step S300). The address codes is configured to simulate the addresses of the registers 210A-210M. For example, each of the address codes is a simulated address. In some embodiments, the simulated address (that is, the address code) may be generated by a random function module (not shown in the figure) of the chip verification system 20 by using random numbers.

Next, the return module 233 obtains, according to the received address code, the address subject and the attribute parameter corresponding to the received address code from the register database 231, and outputs the corresponding attribute parameter (step S302). Specifically, the return module 233 compares the received address codes with the address subjects in the register database 231 to find the address subject identical to the address codes and the corresponding attribute parameters. Then, the return module 233 outputs the found attribute parameters to the sources (that is, the agent modules 22A-22D) of the received address codes.

After the agent modules 22A-22D receive the attribute parameters returned by the return module 233, the driver modules 222A-222D of the agent modules 22A-22D call, according to the received outputted attribute parameters, the corresponding access modules 232 to respectively perform operations on the registers 210A-210M of the DUT circuit 21 according to read write commands of the sequences 220A-220D of the agent modules 22A-22D (step S304).

For example, the address codes correspond to the address subjects (that is, the simulated addresses correspond to the addresses of the registers 210A-210M). Upon calling of the corresponding access modules 232, the driver modules 222A-222D respectively transmit, according to the read write commands and the address codes of the sequences 220A-220D of the agent modules 22A-22D and function command sets of the called access modules 232, agent signals to the DUT circuit 21 by using the interface of the register model 23 (or directly by using the foregoing virtual interface). The DUT circuit 21 (or the register control circuit 212) performs operations on the registers 210A-210M corresponding to the address codes in response to the agent signal (for example, writes to-be-configured data in the sequences 220A-220D into the registers 210A-210M respectively or reads the data in the registers 210A-210M). Thus, since each access module 232 corresponds to one of the attribute parameters, and different access modules 232 have function command sets of different manners allowed for accessing the registers 210A-210M, the driver modules 222A-222D may respectively perform operations on the registers 210A-210M in different manners allowed for accessing, so as to simulate the different manners allowed for accessing the storage element of the chip.

Next, the scoreboard module 24 records each performed operation to generate an operation record (step S306). Then, the scoreboard module 24 records and temporarily stores the data in the registers 210A-210M according to the operation records (such as the data written into the registers 210A-210M in response to the foregoing operations or a preset default value existing when none is written into the registers 210A-210M), and outputs a verification result (step S308). The operation records include the address codes, the attribute parameters, and the read write commands that are executed. Therefore, a user may learn whether the function of the DUT circuit 21 is correct by using the verification result, and since the operations and the operation records thereof may be the different manners allowed for accessing the registers 210A-210M, function verification of the registers 210A-210M to be accessed in different manners can be realized by using a single verification system. The verification system can also simulate accessing statuses of the registers 210A-210M at different operation phases (such as an initialization phase, a stable power supply phase and a normal operation phase).

The foregoing initialization phase means setting made for the storage element of the chip during initialized setting upon power-on of the chip. For example, under the initialized setting, a model and a version number of the chip are written into the storage element of the chip by using eFuse, which are not changed after the writing. The initialization phase of the chip corresponds to a reset phase performed when the chip verification system 20 is configured to simulate the operation of the chip. The foregoing stable power supply phase means a time period during which the chip has been stably powered but not yet operates normally, at this time, setting different from that of the initialization phase is made for the storage element. For example, at the stable power supply phase, an allowed frequency band is written into the storage element of the chip, so that the chip operates at the frequency band. The stable power supply phase of the chip corresponds to a configure phase performed when the chip verification system 20 is configured to simulate the operation of the chip. The foregoing normal operation phase means a phase during which the chip has operated normally. At this time, since some operation modes or some operation functions of the chip need to be switched due to some reasons, setting different from those of the initialization phase and the stable power supply phase is made for the storage element. For example, at the normal operation phase, in response to some situations, the data of the storage element may be changed to enable or disable a flow control function of the chip. The normal operation phase of the chip corresponds to a main phase performed when the chip verification system 20 is configured to simulate the operation of the chip.

In some embodiments, the scoreboard module 24 includes an expectation module 240, a fact module 241, and a comparison module 242. The comparison module 242 is coupled to the expectation module 240 and the fact module 241. During the operations on the registers 210A-210M (such as transmitting the agent signals to the DUT circuit 21), the driver modules 222A-222D transmit, to the scoreboard module 24, information related to the foregoing operations such as the address codes, the attribute parameters, and the read write commands that are executed. Then, the scoreboard module 24 may generate the operation records according to the address codes, the attribute parameters, and the read write commands, and store the operation records in the expectation module 240. In some embodiments, the expectation module 240 may have a plurality of expectation sub-modules 243A-243D, and the operation records corresponding to the different driver modules 222A-222D may be respectively stored in the different expectation sub-modules 243A-243D. For example, the operation record corresponding to the driver module 222A is stored in the expectation sub-module 243A, the operation record corresponding to the driver module 222B is stored in the expectation sub-module 243B, and so on.

The fact module 241 stores the data from the registers 210A-210M of the DUT circuit 21. For example, the DUT circuit 21 outputs the data of the operated registers 210A-210M by using a data signal when each foregoing operation is performed. Each of the agent modules 22A-22D further includes a monitor (not shown in the figure). The monitor is configured to monitor the data signal outputted by the DUT circuit 21 and transmit the monitored data signal to the fact module 241 for storage.

The comparison module 242 compares the operation records stored in the expectation module 240 and the data signals stored in the fact module 241 to outputs a verification result. For example, if the operation records are the same as the data in the registers 210A-210M carried in the data signal, the comparison module 242 outputs a verification result "correct function", or otherwise outputs a verification result "incorrect function". The verification result may be a digital value to indicate "correct function" or "incorrect function". For example, "correct function" may be represented by using a digital value "0", and "incorrect function" may be represented by using a digital value "1", but the present invention is not limited thereto.

The comparison module 242 compares the operation records stored in the expectation module 240 and the data signal stored in the fact module 241 is further described below by using examples. It is assumed that the driver module 222A performs an operation of writing data "11111" into the first register 210A. The comparison module 242 compares an operation record corresponding to the operation that is in the expectation module 240 and data stored in the fact module 241 that is from the first register 210A. If the operation record and the data are both the stored data "11111", the comparison module 242 outputs the verification result "correct function". If the data stored in the expectation module is different from that stored in the fact module (for example, the data "11111" cannot be written into the first register 210A because the first register is a read-only register, and therefore the fact module 241 does not store the data "11111", but the expectation module 240 stores the operation record having the data "11111"; for another example, since the address code used by the driver module 222A corresponds to none of the address subjects of the registers 210A-210M, the data "11111" cannot be correctly written into the first register 210A, and therefore the fact module 241 does not store the data "11111", but the expectation module 240 stores the operation record having the data "11111"), the verification result "incorrect function" is outputted.

In some embodiments, the agent modules 22A-22D may correspond to the access modules 232 one by one (that is, the agent modules 22A-22D respectively correspond to a different access manner), and the driver modules 222A-222D may call only respective corresponding access modules 232 (for example, the driver module 222A may call only an indirect module 234A described later, the driver module 222B may call only an indirect module 234B described later, the driver module 222C may call only a direct module 235A described later, and the driver module 222D may call only a direct module 235B described later). In this way, the power consumption of the chip verification system 20 can be reduced.

In some embodiments, each attribute parameter includes an access parameter, and the access parameter is one of at least one direct access or one of at least one indirect access. The direct access means that the registers 210A-210M are directly accessed by using an interface (such as the output/input interface of the foregoing DUT circuit 21) affording communication with the outside. If there are a plurality of direct accesses, the direct accesses may respectively correspond to an output/input interface using a different communication protocol, such as an interface of an inter-integrated circuit (I2C) or an interface of a serial peripheral interface (SPI). The indirect access means that the registers 210A-210M are accessed by using a path list (that is, some of the registers 210A-210M cannot be directly accessed by using the foregoing output/input interface, instead, can be accessed by using a specific condition or rule). For example, in order to access a fifth register 210E, the first register 210A to the fourth register 210D and an eleventh register 210K to a twelfth register 210L need to be set to a preset value by using the interface of the register model 23, so as to access the fifth register 210E by using the interface of the register model 23. Then, performing an operation on the fifth register. The action of setting the first register 210A to the fourth register 210D and the eleventh register 210K to the twelfth register 210L is the path list. If there are a plurality of indirect accesses, the indirect accesses may be classified into different indirect access types such as eFuse indirect access and EEPROM indirect access by using different path lists.

Figure 4:
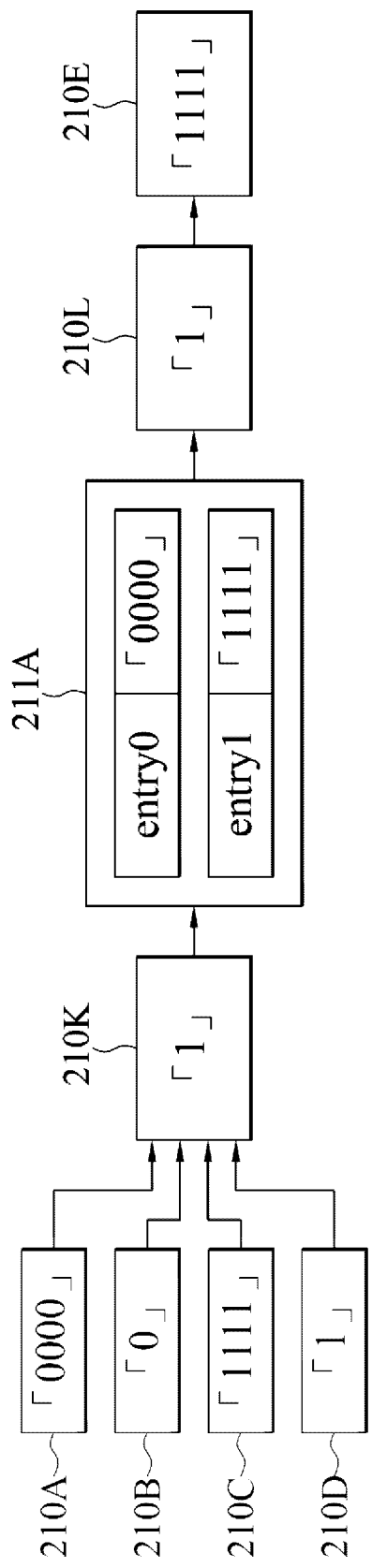
FIG. 4 is a schematic structural diagram of eFuse indirect access according to some embodiments of the present disclosure.

The eFuse indirect access is described below. Referring to FIG. 4, FIG. 4 is a schematic structural diagram of eFuse indirect access according to some embodiments of the present disclosure. The chip verification system 20 may simulate an operation of eFuse at a reset phase, to verify whether a function of eFuse is correct or not. For example, the eFuse is configured to write the model and the version number of the chip into the fifth register 210E. The DUT circuit 21 further includes an eFuse memory module 211A for storing data to be written into the fifth register 210E. The data in the eFuse memory module 211A is obtained from the first register 210A to the fourth register 210D. Specifically, the first register 210A stores the address of the fifth register 210E (for example, a digital value "0000"), the second register 210B stores an entry No. (for example, a first entry (entry 0) which is specifically represented by using a digital value "0") in which the data in the first register 210A is to be stored into the eFuse memory module 211A, the third register 210C stores the model and the version number (for example, a digital value "1111"), and the fourth register 210D stores an entry No. (for example, a second entry (entry 1) which is specifically represented by using a digital value "1") in which the data in the third register 210C is to be stored into the eFuse memory module 211A. When the eleventh register 210K is set to a trigger value (for example, the digital value "1"), the DUT circuit 21 enables, by using an auto load module (not shown in the figure), the eFuse memory module 211A to read the first register 210A to the fourth register 210D, so as to store the address of the fifth register 210E into the first entry (entry 0) and store the model and the version number into the second entry (entry 1). When the twelfth register 210L is set to a trigger value (for example, the digital value "1"), the DUT circuit 21 enables, by using the auto load module, the eFuse memory module 211A to access the fifth register 210E according to the address of the fifth register 210E stored in the eFuse memory module 211A, so as to read the data or write the model and the version number into the fifth register 210E. Therefore, the action of setting the first register 210A to the fourth register 210D and the eleventh register 210K to the twelfth register 210L is an eFuse path list.

Figure 5:
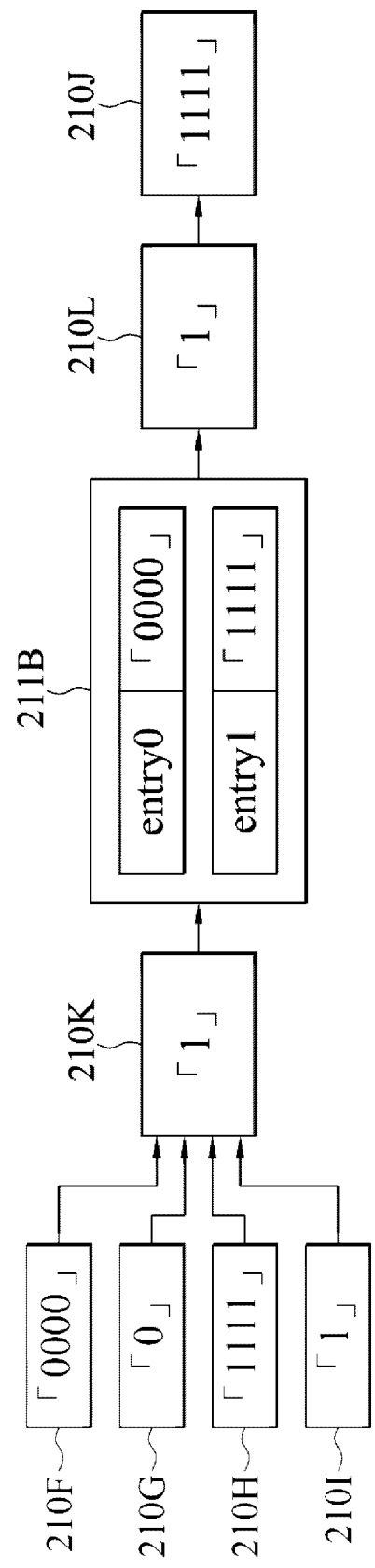
FIG. 5 is a schematic structural diagram of EEPROM indirect access according to some embodiments of the present disclosure.

Likewise, referring to FIG. 5, FIG. 5 is a schematic structural diagram of EEPROM indirect access according to some embodiments of the present disclosure. A manner of operating a sixth register 210F to a tenth register 210J, the eleventh register 210K to the twelfth register 210L, and an EEPROM memory module 211B is the same as the manner of operating the first register 210A to the fifth register 210E, the eleventh register 210K to the twelfth register 210L, and the eFuse memory module 211A. An action of setting the sixth register 210F to the ninth register 210I and the eleventh register 210K to the twelfth register 210L is an EEPROM path list. For concision of the description of the present disclosure, details are not described herein.

In some embodiments, as shown in FIG. 2, the access modules 232 include at least one of direct modules 235A and 235B and at least one of indirect modules 234A and 234B. Although FIG. 2 illustrates two direct modules 235A and 235B and two indirect modules 234A and 234B, the present invention is not limited thereto. A quantity of the direct modules 235A and 235B and a quantity of the indirect modules 234A and 234B may be set according to the quantity of the agent modules 22A-22D. Specifically, the access modules 232 respectively correspond to an access parameter of one of the attribute parameters. For example, the indirect module 234A corresponds to the eFuse indirect access, the indirect module 234B corresponds to the EEPROM indirect access, the direct module 235A corresponds to the I2C direct access, and the direct module 235B corresponds to the SPI direct access.

In some embodiments, the foregoing read write command is a read command, a write command, or a read and write command. In some embodiments of step S304, the driver modules 222A-222D of the agent modules 22A-22D call, according to the access parameters in the received attribute parameters, the corresponding access modules 232 to perform operations corresponding to the read write commands of the agent modules 22A-22D on the registers 210A-210M of the DUT circuit 21 (specifically, perform operations corresponding to the read write commands on the registers 210A-210M according to the address codes and the function command sets of the called access module 232). Specifically, if the read write command is a read command, a read operation is performed, if the read write command is a write command, a write operation is performed, or if the read write command is a read and write command, a read and write operation is performed.

For example, if the access parameter of the attribute parameter received by the agent module 22A is the eFuse indirect access, the driver module 222A calls the function command set of the indirect module 234A. If the access parameter of the attribute parameter received by the agent module 22B is the EEPROM indirect access, the driver module 222B calls the function command set of the indirect module 234B. If the access parameter of the attribute parameter received by the agent module 22C is the I2C direct access, the driver module 222C calls the function command set of the direct module 235A. If the access parameter of the attribute parameter received by the agent module 22D is the SPI direct access, the driver module 222D calls the function command set of the direct module 235D. Therefore, the operations can be perform on the registers 210A-210M.

In some embodiments, the chip verification system 20 further includes a selection module 26. The selection module 26 is coupled to the agent modules 22A-22D. The selection module 26 is configured to enable at least one of the agent modules 22A-22D in response to a set parameter. The set parameter may be inputted by a user. For example, the user may input the set parameter according to the operation phase or the access manner of the DUT chip, to enable a corresponding one of the agent modules 22A-22D, so as to perform corresponding verification on the registers 210A-210M of the DUT circuit 21. For example, in order to verify the eFuse access at the initialization phase of the chip, the agent module 22A may be enabled to verify the register (such as 210A-210E and 210K-210L) related to eFuse. In order to verify the EEPROM access, the agent module 22B may be enabled. In order to verify the I2C access, the agent module 22C may be enabled. In order to verify the SPI access, the agent module 22D may be enabled.

In some embodiments, the attribute parameter further includes a read write parameter. The read write parameter is a read write attribute of the registers 210A-210M. For example, the read write parameter is an attribute related to a read and write function of the registers 210A-210M, such as a read only parameter or a read and write parameter (that is, the registers 210A-210M are read-only registers or read and write registers), a write-only parameter, a clean-on-read (RC) parameter, or a write-one-to-set (W1S) parameter. In some embodiments, the attribute parameter further includes data of domain fields of the registers 210A-210M. Bits of the registers 210A-210M may be divided into a plurality of domain fields. For example, if the registers 210A-210M each have 32 bits, first 16 bits may be grouped as a first domain field, and last 16 bits may be grouped as a second domain field. However, the present invention is not limited thereto. Data of the foregoing domain fields may be read write attributes of corresponding bits of the registers 210A-210M in the domain fields.

In some embodiments, the foregoing operations performed on the registers 210A-210M may be classified into a valid operation and an invalid operation. The valid operation means a success of correctly reading the data in the registers 210A-210M or correctly writing data into the registers 210A-210M. The invalid operation means a failure of correctly reading the data in the registers 210A-210M or a failure of writing data into the registers 210A-210M. In some embodiments, if the read write parameters of the operated registers 210A-210M are different from the read write commands executed by the driver modules 222A-222D (for example, when the read write parameters are read only parameters, but the read write commands are write commands), the driver modules 222A-222D perform invalid operations on the registers 210 by using the DUT circuit 21. The DUT circuit 21 outputs an error prompt signal in response to the invalid operation, so that the user learns that an erroneous operation is performed.

In some embodiments, since the simulated address (that is, the address code) may be generated by the random function module by using random numbers, the simulated address may conform to the design specifications of the chip (that is, the simulated address corresponds to the address of one of the registers 210A-210M, in other words, the address code corresponds to the address subject of one of the registers 210A-210M), or may not conform to the design specifications of the chip (that is, the simulated address corresponds to the address of none of the registers 210A-210M, in other words, the address code corresponds to the address subject of none of the registers 210A-210M).

The invalid operation caused when the address code corresponds to no address subject is described below. In some embodiments, the register database 231 further stores an other attribute parameter (which is referred to as an invalid attribute parameter below) having an erroneous parameter. In some embodiments of step S302, when the address code received by the return module 233 has no corresponding address subject, the return module 233 obtains an invalid attribute parameter from the register database 231. Then, the return module 233 outputs the invalid attribute parameter. For example, the return module 233 compares the received address code with the address subject of the register database 231. When no same address subject is found, an invalid attribute parameter is acquired, and the invalid attribute parameter is outputted to a source (that is, the agent modules 22A-22D) of the previously received address code.

In some embodiments of step S304, when the received attribute parameter has the erroneous parameter (that is, the invalid attribute parameter), the driver modules 222A-222D of the agent modules 22A-22D perform an invalid operation on the registers 210A-210M of the DUT circuit 21 according to the read write commands of the agent modules 22A-22D (specifically, perform the invalid operation on the registers 210A-210M of the DUT circuit 21 according to the address codes and the function command sets of the called access module 232). For example, it is assumed that the driver modules 222A-222D receive the invalid attribute parameter and are about to perform write operations on the registers 210A-210M. Since the address code corresponds to the address subject of none of the registers 210, the driver modules 222A-222D transmit an invalid agent signal to the DUT circuit 21 by using the interface of the register model 23 (or directly by using the foregoing virtual interface). The DUT circuit 21 performs an invalid operation in response to the invalid agent signal (that is, the to-be-configured data of the sequences 220A-220D is not successfully written into any of the registers 210A-210M), that is, the driver modules 222A-222D perform the invalid operation by using the DUT circuit 21. Afterwards, the DUT circuit 21 outputs an error prompt signal in response to the invalid operation, so that the user learns that an erroneous operation is performed.

The valid operation caused when the address code corresponds to the address subject is described below. In some embodiments of step S302, when the address code received by the return module 233 has the corresponding address subject, the return module 233 obtains the attribute parameter corresponding to the address subject. Then, the return module 233 outputs the attribute parameter. In some embodiments of step S304, the driver modules 222A-222D of the agent modules 22A-22D call, according to the received attribute parameters, the corresponding access modules 232 to perform, according to the read write commands and the address codes of the agent modules 22A-22D, operations (valid operations) on the registers 210A-210M of the DUT circuit 21 that are associated with the address codes.

For example, it is assumed that the driver module 222A is about to write data into the fifth register 210E. The driver module 222A calls, according to the attribute parameter, the indirect module 234A to transmit an agent signal to the DUT circuit 21 when the address (that is, the address subject) of the fifth register 210E is "1234", the attribute parameter of the fifth register is eFuse indirect access, and the simulated address (that is, the address code) of the agent module 22A is "1234". The indirect module 234A generates the agent signal according to the address code, the read write command, and the function command set of the indirect module 234A. The driver module 222A transmits the agent signal to the DUT circuit 21 by using the interface of the register model 23. The DUT circuit 21 sets the first register 210A to the fourth register 210D and the eleventh register 210K to the twelfth register 210L recorded in the eFuse path list in response to the agent signal, and then performs an operation of writing to-be-configured data in the sequence 220A into the fifth register 210E.

For another example, it is assumed that the driver module 222C is about to write the data into the thirteenth register 210M. The driver module 222C calls, according to the attribute parameter, the direct module 235A to transmit an agent signal to the DUT circuit 21 when the address (that is, the address subject) of the thirteenth register 210M is "5678", the attribute parameter of the thirteenth register is I2C indirect access, and the simulated address (that is, the address code) of the agent module 22C is "5678". the direct module 235A generates the agent signal according to the address code, the read write command, and the function command set of the direct module 235A. The driver module 222C transmits the agent signal to the DUT circuit 21 by using the foregoing virtual I2C interface. The DUT circuit 21 performs, in response to the agent signal, an operation of writing to-be-configured data in the sequence 220C into the thirteenth register 210M.

In some embodiments, the operation record is a write record, a read record, or a combination thereof. The write record corresponds to a write command, the read record corresponds to a read command, and the combination thereof corresponds to a read and write command.

In some embodiments, at the main phase of the chip verification system 20, the scoreboard module 24 outputs a verification result according to the write records and the data in the registers 210A-210M. If the write records are compared in real time (for example, each time the expectation module 240 of the scoreboard module 24 generates a write record, the fact module 241 of the scoreboard module 24 obtains data from the registers 210A-210M of the DUT circuit 21 corresponding to an address code of the write record for subsequent verification, specifically, each time a write record is generated, the fact module 241 obtains an outputted data signal from the DUT circuit 21, so as to obtain the data in the registers 210A-210M on which the write operation is just performed), the agent signal (that is, the agent signal corresponding to the to-be-compared write record) previously transmitted to the DUT circuit 21 may not be removed from the internal bus 213 the DUT circuit 21. The data acquired by the fact module 241 from the DUT circuit 21 may be the data not removed from the internal bus 213. Therefore, the verification result outputted by the comparison module 242 of the scoreboard module 24 cannot be correctly verified (that is, whether the data is successfully written into the registers 210A-210M of the DUT circuit 21 cannot be correctly verified). Therefore, at the main phase corresponding to the normal operation phase of the chip, the comparison module 242 compares all of the write records in the expectation module 240 with the data stored in the fact module 241 at one time to output a verification result. Therefore, correctly verifying write functions of the registers 210. The data stored in the fact module 241 is the data in the registers 210 that corresponds to all of the write records.

In some embodiments, when read records are generated, the scoreboard module 24 outputs the verification result according to the generated read records and the data in the registers 210A-210M. A difference from the embodiments related to the verification of the foregoing write records lies in that the read records need to be compared in real time. For example, each time a read record is generated, the fact module 241 reads the DUT circuit 21 to acquire data from the registers 210A-210M having addresses (that is, address subjects) the same as a simulated address (that is, an address code) of the read record for subsequent verification. If no data has been written into the registers 210A-210M, a default value of the registers 210A-210M is acquired for comparison with a current read record. If data has been written into the registers 210A-210M, the data written into the registers 210A-210M is acquired for comparison with a current read record.

In conclusion, according to some embodiments of the present disclosure, by means of the plurality of the access modules respectively corresponding to different access manners and the return module capable of returning the attributes of the registers of the chip, function verification of the registers to be accessed in different manners can be realized by using a single verification system, thereby reducing workloads and a design duration of the verification system, and enhancing portability and verification coverage of the verification system.

What is claimed is:

1. A chip verification system, adapted to verify a design under test (DUT) circuit, the DUT circuit comprising a plurality of registers, and the chip verification system comprising:
   a plurality of agent modules, wherein each agent module comprises a sequence and a driver module, and each sequence comprises an address code and a read write command;
   a register model comprising:
      a register database, storing an address subject and an attribute parameter of each register, wherein the address subject corresponds to the attribute parameter of the same register;
      a plurality of access modules, wherein each access module corresponds to one of the attribute parameters; and
      a return module, wherein each agent module is configured to transmit the address code of the sequence of its own to the return module, and the return module is configured to obtain, according to the received address code, the address subject and the attribute parameter corresponding to the received address code from the register database, and output the corresponding attribute parameter; the driver module of each agent module is configured to call, according to the received output attribute parameter, the corresponding access module to perform an operation on the registers of the DUT circuit according to the read write command of the same agent module; and
   a scoreboard module, configured to record each performed operation to generate an operation record, and output a verification result according to the operation records and data in the registers.

2. The chip verification system according to claim 1, wherein the read write command is a read command, a write command, or a read and write command, each attribute parameter comprises an access parameter, the access parameter is one of at least one direct access or one of at least one indirect access, the access modules comprise at least one direct module and at least one indirect module, and the driver module of each agent module is configured to call, according to the access parameter in the received attribute parameter, the corresponding access module to perform the operation corresponding to the read write command of the same agent module on the registers of the DUT circuit.

3. The chip verification system according to claim 2, wherein the attribute parameter further comprises a read write parameter, the read write parameter is a read only parameter or a read and write parameter, and the operation record comprises the address code, the attribute parameter, and the read write command that are executed.

4. The chip verification system according to claim 2, further comprising a selection module configured to enable at least one of the agent modules in response to a set parameter.

5. The chip verification system according to claim 1, wherein the operation has an invalid operation, the register database further stores an other attribute parameter having an erroneous parameter, when the address code received by the return module does not have the corresponding address subject, the return module is configured to obtain the other attribute parameter from the register database and output the other attribute parameter, when the received attribute parameter has the erroneous parameter, the driver module of each agent module is configured to perform, according to the read write command of the same agent module, the invalid operation on the registers of the DUT circuit, and the DUT circuit is configured to output an error prompt signal in response to the invalid operation.

6. The chip verification system according to claim 1, wherein when the received address code has the corresponding address subject, the return module is configured to obtain the corresponding attribute parameter and output the corresponding attribute parameter, and the driver module of each agent module is configured to call, according to the received output attribute parameter, the corresponding access module to perform, according to the read write command and the address code of the same agent module, the operation on each register of the DUT circuit that is associated with the address code.

7. The chip verification system according to claim 1, wherein the operation record is a write record, a read record, or a combination thereof, and at a main phase of the chip verification system, the scoreboard module is configured to output the verification result according to the write records and the data in the registers.

8. The chip verification system according to claim 7, wherein when the read record is generated, the scoreboard module is configured to output the verification result according to the generated read record and the data in the registers.

9. The chip verification system according to claim 1, wherein the operation record is a write record, a read record, or a combination thereof, and at a main phase of the chip verification system, outputting, by the scoreboard module, the verification result according to the write records and the data in the registers.

10. The chip verification system according to claim 9, wherein when the read record is generated, outputting, by the scoreboard module, the verification result according to the generated read record and the data in the registers.

11. A verification method for a chip verification system, adapted to verify a DUT circuit, the DUT circuit comprising a plurality of registers, the chip verification system comprising a plurality of agent modules, a register model, and a scoreboard module, the register model comprises a register database, a plurality of access modules, and a return module, wherein each agent module comprises a sequence and a driver module, the register database stores an address subject and an attribute parameter of each register, the address subject corresponds to the attribute parameter of the same register, and the verification method comprises:

transmitting, by each agent module, an address code of the sequence of the each agent module to the return module, wherein each sequence comprises an address code and a read write command, and each access module corresponds to one of the attribute parameters;

obtaining, by the return module according to the received address code, the address subject and the attribute parameter corresponding to the received address code from the register database, and outputting the corresponding attribute parameter;

calling, by the driver module of each agent module according to the received output attribute parameter, the corresponding access module to perform an operation on the registers of the DUT circuit according to the read write command of the same agent module;

recording, by the scoreboard module, each performed operation to generate an operation record; and outputting, by the scoreboard module, a verification result according to the operation records and data in the registers.

12. The verification method for a chip verification system according to claim 11, wherein the read write command is a read command, a write command, or a read and write command, each attribute parameter comprises an access parameter, the access parameter is one of at least one direct access or one of at least one indirect access, the access modules comprise at least one direct module and at least one indirect module, and calling, by the driver module of each agent module according to the access parameter in the received attribute parameter, the corresponding access module to perform the operation corresponding to the read write command of the same agent module on the registers of the DUT circuit.

13. The verification method for a chip verification system according to claim 12, wherein the attribute parameter further comprises a read write parameter, the read write parameter is a read only parameter or a read and write parameter, and the operation record comprises the address code, the attribute parameter, and the read write command that are executed.

14. The verification method for a chip verification system according to claim 12, wherein the chip verification system further comprises a selection module, the verification method further comprises starting, by the selection module, at least one of the agent modules in response to a set parameter.

15. The verification method for a chip verification system according to claim 11, wherein the operation has an invalid operation, the register database further stores an other attribute parameter having an erroneous parameter, when the address code received by the return module does not have the corresponding address subject, obtaining, by the return module, the other attribute parameter from the register database and outputting the other attribute parameter, when the received attribute parameter has the erroneous parameter, performing, by the driver module of each agent module according to the read write command of the same agent module, the invalid operation on the registers of the DUT circuit, and outputting, by the DUT circuit, an error prompt signal in response to the invalid operation.

16. The verification method for a chip verification system according to claim 11, wherein when the received address code has the corresponding address subject, obtaining, by the return module, the corresponding attribute parameter and outputting the corresponding attribute parameter, and calling, by the driver module of each agent module according to the received output attribute parameter, the corresponding access module to perform, according to the read write command and the address code of the same agent module, the operation on each register of the DUT circuit that is associated with the address code.

* * * * *